(12) United States Patent
Hiller

(10) Patent No.: US 11,081,423 B2
(45) Date of Patent: Aug. 3, 2021

(54) POWER DISTRIBUTION BY A WORKING FLUID CONTAINED IN A CONDUIT

(71) Applicant: The Boeing Company, Chicago, IL (US)

(72) Inventor: Nathan D. Hiller, Irvine, CA (US)

(73) Assignee: The Boeing Company, Chicago, IL (US)

( * ) Notice: Subject to any disclaimer, the term of this patent is extended or adjusted under 35 U.S.C. 154(b) by 260 days.

(21) Appl. No.: 15/641,914

(22) Filed: Jul. 5, 2017

(65) Prior Publication Data
US 2017/0309545 A1    Oct. 26, 2017

Related U.S. Application Data

(63) Continuation-in-part of application No. 13/596,639, filed on Aug. 28, 2012, now Pat. No. 9,728,702.

(51) Int. Cl.
| | |
|---|---|
| *H01L 23/473* | (2006.01) |
| *H01L 35/30* | (2006.01) |
| *H01L 35/32* | (2006.01) |
| *F01N 5/02* | (2006.01) |
| *H01L 27/16* | (2006.01) |
| *H01L 35/34* | (2006.01) |

(52) U.S. Cl.
CPC ............ *H01L 23/473* (2013.01); *H01L 35/30* (2013.01); *H01L 35/32* (2013.01); *H01L 35/34* (2013.01); *F01N 5/025* (2013.01); *H01L 27/16* (2013.01)

(58) Field of Classification Search
CPC ....... H01L 23/38; H01L 23/46; H01L 23/467; H01L 23/473; H01L 35/30; H01L 35/32; H01L 27/16; H01L 35/34; F01N 5/025
USPC .................................................. 136/200–242
See application file for complete search history.

(56) References Cited

U.S. PATENT DOCUMENTS

| | | |
|---|---|---|
| 6,492,585 B1 | 12/2002 | Zamboni et al. |
| 6,914,343 B2 | 7/2005 | Hiller et al. |
| 7,012,554 B2 | 3/2006 | Hiller et al. |
| 7,649,138 B2 | 1/2010 | Hiller et al. |

(Continued)

OTHER PUBLICATIONS

"Thermoelectric effect," http://en.wikipedia.org/wiki/Thermoelectric_effect (2004).

(Continued)

*Primary Examiner* — Eli S Mekhlin
*Assistant Examiner* — Dujuan A Horton
(74) *Attorney, Agent, or Firm* — Vivacqua Crane

(57) ABSTRACT

A system and method system for conveying power from a heat source is disclosed. The system includes a conduit constructed of a heat conducting material. The conduit defines a passageway containing a primary working fluid, where the conduit is either mounted upon or extends within at least a portion of a barrier. The conduit is configured to conduct thermal energy generated by the heat source and transfer the thermal energy to the primary working fluid flowing within the passageway. The system also includes a thermoelectric generator in thermal communication with the conduit. The thermoelectric generator has a hot side and a cold side. The primary working fluid transfers the thermal energy to the hot side of the thermoelectric generator to heat the hot side of the thermoelectric generator to a temperature greater than the cold side and create electric current.

20 Claims, 8 Drawing Sheets

(56) References Cited

U.S. PATENT DOCUMENTS

| | | | | |
|---|---|---|---|---|
| 2002/0162339 A1* | 11/2002 | Harrison | ............... | F25B 21/02 |
| | | | | 62/3.7 |
| 2008/0135081 A1 | 6/2008 | Sharifi et al. | | |
| 2010/0024859 A1* | 2/2010 | Bell | .............. | F01N 5/025 |
| | | | | 136/201 |
| 2012/0199171 A1* | 8/2012 | Watts | ................. | H01L 35/30 |
| | | | | 136/205 |
| 2015/0021755 A1* | 1/2015 | Hsiao | .............. | H01L 25/0657 |
| | | | | 257/714 |
| 2016/0133812 A1* | 5/2016 | Onose | ................ | H01L 35/04 |
| | | | | 136/205 |

OTHER PUBLICATIONS

Jovanovic, V., "Alternative Methods of Wireless Sensor Power," SBIR 2005, Navy, Contract # N052-130-0459, retrieved at http://www.sbir.gov/sbirsearch/detail/181248 (2005).

Kushch, A., "Thermoelectric Power Generation and Management Module," SBIR 2007, Contract #N062-140-0180, retrieved at http://www.sibr.gov/sbirsearch/detail/181262 (2007).

Sherrit, S. et al., "Studies of Acoustic-Electric Feed-throughs for Power Transmission Through Structures," Smart Structures and Materials Symposium, San Diego, California, retrieved at http://trs-new.ipl.nasa.gov/dspace/handle/2014/38890 (Feb. 27, 2006).

Tan, L. et al., "Thermal Performance of Two-Phase Closed Thermosyphon in Application of Concentrated Thermoelectric Power Generator Using Phase Change Material Thermal Storage," Frontiers in Heat Pipes; Global Digital Central, ISSN: 2155-658X, DOI: 10.5098/fhp.v2.4.3001 (2011).

U.S. Non-Final Office Action, U.S. Appl. No. 13/596,639; 10 pages (dated Mar. 13, 2014).

U.S. Final Office Action, U.S. Appl. No. 13/596,639; 13 pages (dated Jul. 23, 2014).

U.S. Advisory Action, U.S. Appl. No. 13/596,639; 3 pages (dated Sep. 30, 2014).

U.S. Examiner's Answer to Appeal Brief, U.S. Appl. No. 13/596,639; 13 pages (dated May 22, 2015).

U.S. Patent Board Decision, U.S. Appl. No. 13/596,639; 5 pages (dated Dec. 1, 2016).

U.S. Notice of Allowance, U.S. Appl. No. 13/596,639; 7 pages (dated Apr. 4, 2017).

Graham, D. et al., "Investigation of Methods for Data Communication and Power Delivery Through Metals," IEEE Trans. on Industrial Electronics, vol. 58, No. 1o, pp. 4972-4980 (2011).

Nowacki, K., "The sound velocity in an alloy steel at high temperature conditions," Int. J. Thermophysics, vol. 31, No. 1, pp. 103-112 (Jan. 2010).

Shoudy, D. et al., "P3F-5 an ultrasonic through-wall communication system with power harvesting," Proc. IEEE Ultrason. Symp., pp. 1848-1853 (Oct. 2007).

* cited by examiner

POWER DISTRIBUTION BY A WORKING FLUID CONTAINED IN A CONDUIT

PRIORITY

This application is a continuation-in-part of U.S. patent application Ser. No. 13/596,639 filed on Aug. 28, 2012, and entitled Power Delivery Through a Barrier, by inventor Nathan D. Hiller. The entirety of this priority application is hereby incorporated by reference.

FIELD

The disclosure relates to methods and systems for power distribution and, more particularly, to methods and systems in which thermal energy is conveyed by a conduit containing working fluid, where the conduit is either mounted upon or extends within at least a portion of a barrier.

BACKGROUND

It is often necessary to power an electronic component, such as a sensor, in an environment that is not readily accessible to electric power. An example of such an environment may be found on naval vessels, which may require multiple sensors to monitor systems and processes to improve efficiency, reliability and safety. Although sensor communications may be transmitted wirelessly, providing electric power to such sensors typically requires wires. Running wires to such sensors often may require penetration of steel walls that may be as thick as 20 mm. Drilling holes in such walls or bulkheads may be unacceptable because it may compromise the structural integrity of the wall or bulkhead. Also, passing wires to these types of sensors is often an expensive and time consuming process.

Another application in which sensor access to electrical power may be difficult is in an aircraft or space vehicle, which may require airtight barriers between pressurized compartments and the ambient. While it is known to provide gaskets and other devices that enable electric wires to penetrate a barrier or bulkhead, such gaskets and devices may be subject to degradation in integrity over time, which may result in leakage.

A further application in which a sensor or other electrically powered device may be placed in an environment in which it is difficult to access electrical power is in a sealed chamber that may contain a dangerous or toxic substance, such as a virus, radioactive material or chemical agents, or conversely, a clean room that is sealed from the ambient. Again, it is desirable to provide the sealed chamber with walls enclosing such materials that minimize the number of openings for passage of electrical wires to power sensors and other electrical components, thereby minimizing the likelihood of breaching the sealed chamber enclosure and leakage of the contents of the chamber to the ambient, or conversely, leakage of the ambient into the chamber.

SUMMARY

Accordingly, there is a need to provide a system and method for delivery of power for an electrical component that may be transmitted through or along a barrier without the necessity of passing electrical wires, conduits and other conventional mechanisms for conveying electricity through or along the barrier. The disclosed system includes a conduit for transporting a primary working fluid from a heat source to one or more thermoelectric generators to transmit power. The conduit is either mounted upon or extends within at least a portion of a barrier. The disclosed system does not require for the thermoelectric generator to be placed in a location along the barrier adjacent to the heat source in order to transfer the thermal energy. This is because power is transmitted by the primary working fluid within the conduit. Thus, the disclosed system provides enhanced flexibility when determining the specific location of the heat source and the various thermoelectric generators.

In one embodiment, a system for conveying power from a heat source is disclosed. The system includes a conduit constructed of a heat conducting material. The conduit defines a passageway containing a primary working fluid, where the conduit is either mounted upon or extends within at least a portion of a barrier. The conduit is configured to conduct thermal energy generated by the heat source and transfer the thermal energy to the primary working fluid flowing within the passageway. The system also includes a thermoelectric generator in thermal communication with the conduit. The thermoelectric generator has a hot side and a cold side. The primary working fluid transfers the thermal energy to the hot side of the thermoelectric generator to heat the hot side of the thermoelectric generator to a temperature greater than the cold side and create electric current.

In another embodiment, a system for conveying power from a cooling source is disclosed. The system includes a conduit constructed of a heat conducting material. The conduit defines a passageway that contains a primary working fluid. The conduit extends within at least a portion of a barrier. The conduit is configured to conduct cooling by the cooling source and transfer the cooling to the primary working fluid flowing within the passageway. The system also includes a thermoelectric generator in thermal communication with the conduit. The thermoelectric generator has a hot side and a cold side. The primary working fluid transfers the cooling to the cold side of the thermoelectric generator to cool the cold side of the thermoelectric generator to a temperature less than the hot side and create electric current.

In yet another embodiment, a method for conveying power from a heat source is disclosed. The method includes generating thermal energy by the heat source. The heat source is in thermal communication with a conduit, and the conduit is either mounted upon or extends within at least a portion of a barrier. The method includes conducting the thermal energy by the conduit. The conduit is constructed of a heat conducting material and defines a passageway that contains a primary working fluid. The method also includes transferring the thermal energy generated by the heat source to the primary working fluid. The method also includes transferring the thermal energy from the primary working fluid to a hot side of a thermoelectric generator.

Other objects and advantages of the disclosed method and system will be apparent from the following description, the accompanying drawings and the appended claims.

BRIEF DESCRIPTION OF THE DRAWINGS

FIG. 9A illustrates the system injecting power into the system, FIG. 9B illustrates the system storing the power within the system, and FIG. 9C illustrates the system transmitting the power to the thermoelectric generator.

DETAILED DESCRIPTION

Figure 1:
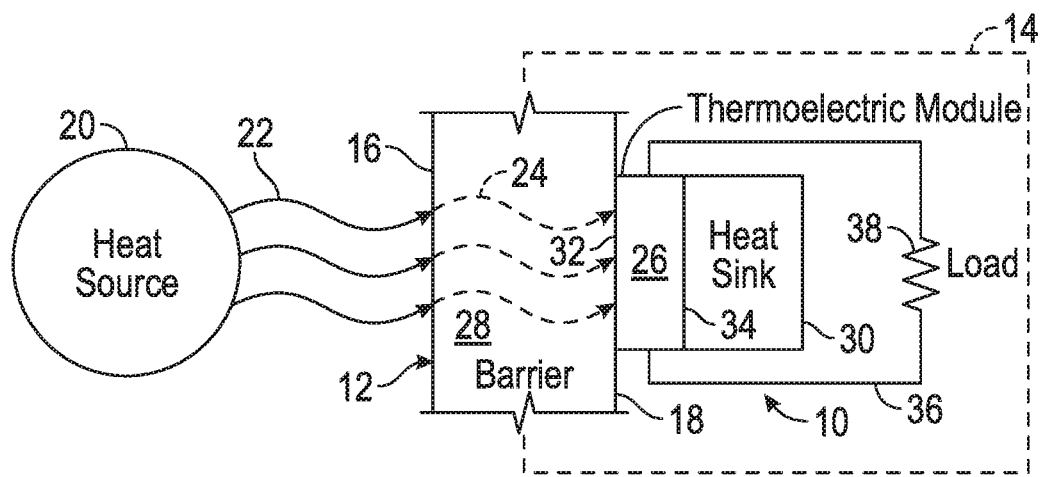
FIG. 1 is a schematic diagram showing the disclosed system and method for power delivery through a barrier.

As shown in FIG. 1, the system for power delivery through a barrier, generally designated 10, is shown positioned adjacent a barrier, generally designated 12. The barrier 12 may be a wall, bulkhead, plate, or other structure. Further, the barrier 12 may be part of an enclosure 14, such as a clean room or other hermetically sealed chamber. In an embodiment, the system 10 is adjacent a barrier 12 that is capable of transmitting or conducting thermal energy. Examples of such barrier materials may include steel, aluminum, and other metals, as well as carbon fiber, glass, and the like. In an embodiment, the barrier 12 may be provided as a continuous, imperforate sheet or plate; that is, a sheet or plate without any type of opening, hole, passageway or conduit from a first side 16 of the barrier to a second side (e.g. opposite side) 18 of the barrier. In embodiments, the barrier 12 may be part of a wall, bulkhead, window (in which it may be made of transparent material such as glass), or a partition.

In an embodiment, the system 10 may include a heat source 20. The heat source may be positioned adjacent the first side 16 of the barrier 12 and generates (e.g. radiates) thermal energy, indicated at 22, that impacts the first side 16 of the barrier 12. The thermal energy 22 is conducted through the barrier 12, as indicated at 24, to the second side 18. In an embodiment, the thermal energy 22 generated by the heat source 20 is less than what would permanently affect the barrier 12. For example, the thermal energy 22 would be less than would deform or melt a barrier 12 made of metal or glass. The system 10 also may include a thermoelectric generator (e.g. thermoelectric module) 26 positioned adjacent the second side 18 of the barrier 12. In an embodiment, the thermoelectric generator 26 may be mounted on the second side 18 of the barrier 12 in a region 28 in which the intensity of the thermal energy 24 traveling through the barrier is greatest. The thermoelectric generator 26 may include a heat sink 30.

The thermoelectric generator 26 may be a thermoelectric module, such as a solid state thermoelectric module. Examples of such thermoelectric modules are manufactured by Laird Technologies (www.lairdtech.com) and Marlow Industries, Inc. (www.marlow.com). Thermoelectric generators 26 that may be used may include a multistage (cascade) thermoelectric module, a ceramic plate thermoelectric module, a thin film thermoelectric module, and others. Such thermoelectric generators (e.g. thermoelectric modules) 26 may operate by "pumping" heat from one (typically ceramic) face to the other (typically ceramic) face when a direct current is applied. Conversely, when one face of the thermoelectric module is heated (e.g. raised to a higher temperature) relative to the other face, direct current (power) is generated. Such thermoelectric modules may utilize the Seebeck effect to convert a temperature differential to a direct current.

In the embodiment shown in FIG. 1, a "hot" side 32 of the thermoelectric generator 26 may be positioned adjacent the second side 18 of the barrier 12, and in an embodiment may be physically attached to the second side, as by appropriate adhesives or mechanical attachments such as screws or brackets (not shown). The "cold" side 34 of the thermoelectric generator 26 may be positioned away from the second side 18 and contacts the heat sink 30. The terms hot (higher) and cold (lower) are intended to describe relative temperatures. Consequently, when thermal energy 24 traverses the barrier 12, it heats the hot side 32 of the thermoelectric generator 26 to a temperature greater than the cold side 34, which results in the creation of an electric current.

As shown in FIG. 1, the electric current created by the thermoelectric generator 26 may travel through an electric circuit 36 to a load, generally designated 38. In an embodiment, the load 38 may be a sensor or other component that requires electricity to operate. In embodiments, the load 38 may be a sensor, clock, display, alarm, or transducer.

Figure 2:
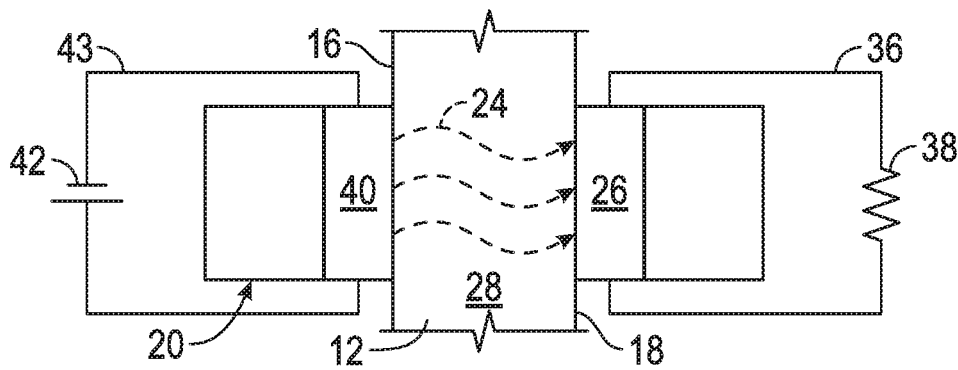
FIG. 2 is an embodiment of the method and system shown in FIG. 1, utilizing a thermoelectric generator as a heat source.

As shown in FIG. 2, in an embodiment, the heat source 20 may be a second thermoelectric generator 40 that is actuated by a source of direct current 42 provided over a circuit 43. In an embodiment, the second thermoelectric generator 40 may be of the same design, type or size as the thermoelectric generator 26, or it may be of a different design, type or size. In an embodiment, one or both thermoelectric generators 26, 40 are thermoelectric modules.

In other embodiments, the heat source 20 may be an electric resistance coil, hot water or other heated fluid flowing through a pipe or pipes in the barrier 12, a source of flame, such as a gas burner, directed against (e.g. not in contact with) the barrier, a device for heating the barrier 12 by induction, and a device for heating the barrier 12 by other means, such as by directing infrared radiation on a first surface of the first side 16 adjacent the region 28. With each of the aforementioned devices and methods, the result is that thermal energy 24 may be directed through the barrier 12 in the region 28, a fraction of which may be absorbed by the thermoelectric generator 26, where it is converted to electricity that travels through circuit 36 to power load 38.

Figure 3:
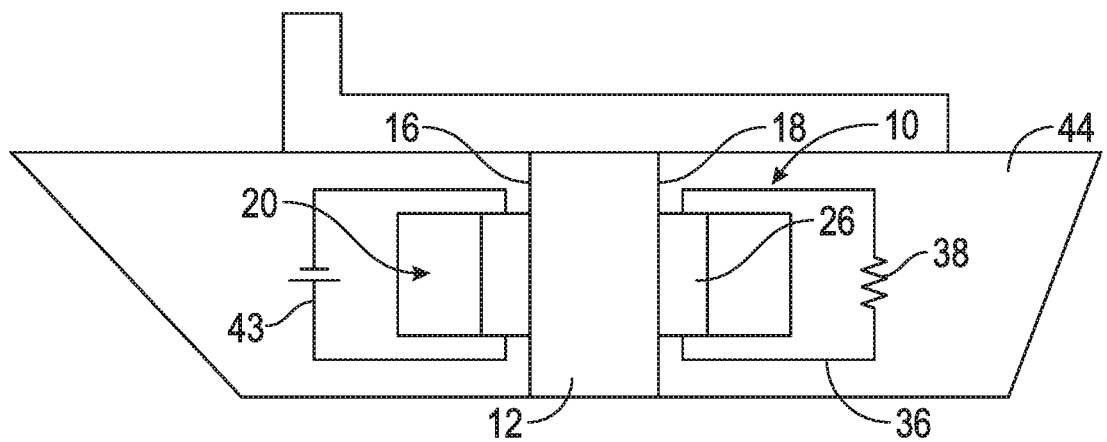
FIG. 3 is schematic depiction of the system and method for power delivery through a barrier, shown mounted in a naval vessel.

As shown in FIG. 3, in an embodiment, the system 10 may be incorporated in a vehicle 44. The barrier 12 may be a bulkhead or other wall within the vehicle 44. The vehicle 44 may be a naval vessel, such as a surface ship, depicted schematically in FIG. 3, or a submarine, either manned or unmanned. In other embodiments, the vehicle 44 may comprise an aircraft or spacecraft (manned or unmanned), or a tank or other armored vehicle (manned or unmanned). As shown in FIG. 3, the thermoelectric generator 26 may be mounted on the second side 18 of the barrier 12. The heat source 20, which may be a second thermoelectric generator 40 (FIG. 2), may be mounted on the first side 16 of the barrier 12.

As shown best in FIG. 2, for the embodiment of FIG. 3, and other embodiments disclosed herein, activation of the heat source 20 causes the heat source to generate thermal energy 22 that impinges the first side 16 of the barrier 12. In other embodiments, the heat source 20 may be mounted on (e.g. in contact with) a first surface of the first side 16 of the barrier 12 (either directly or by way of a solid thermal energy conductor (not shown)), or embedded in the barrier 12, so that thermal energy 22 would not propagate across a space or void from source 20 to barrier 12. The thermal energy 22 propagates as thermal energy 24 through the barrier 12 and heats the thermoelectric generator 26, causing it to generate electric current in circuit 36 that is conducted to and powers the load 38. The system and method described eliminates the need to compromise structural members in order pass through electrical conductors to power electrical devices such as sensors.

Figure 4A:
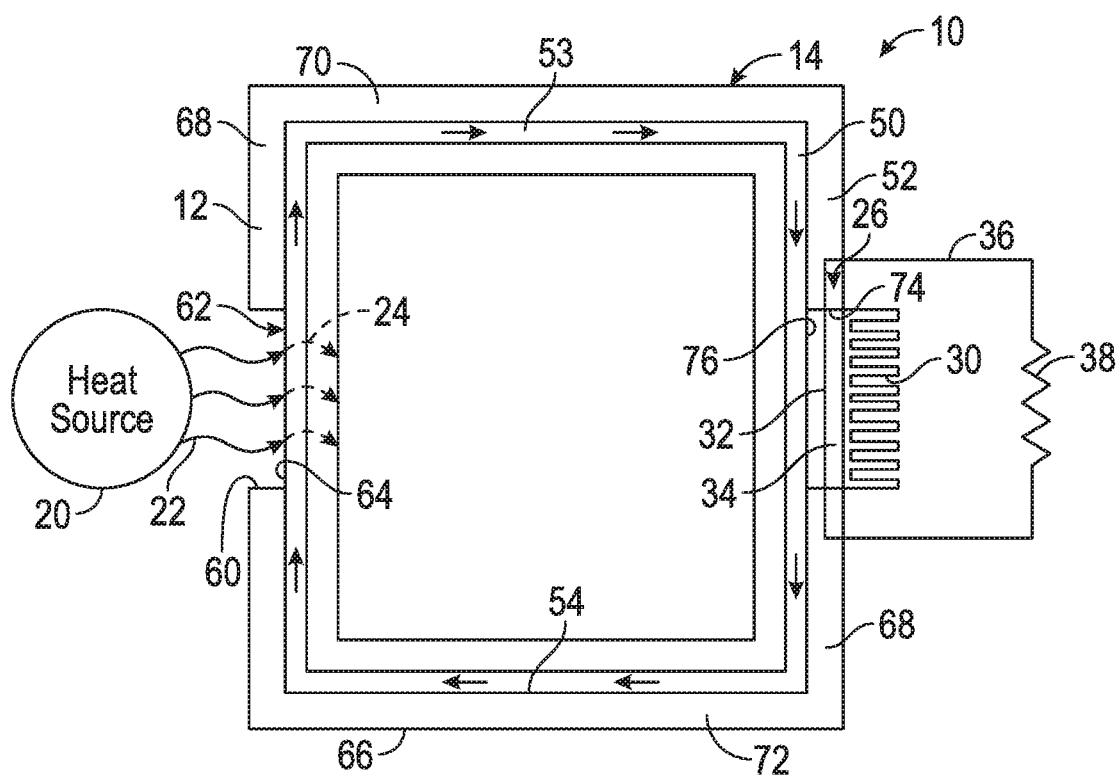
FIG. 4A is a schematic diagram of an alternative embodiment of the disclosed system where a conduit used to distribute power to a thermoelectric generator is located within the barrier.
Figure 4B:
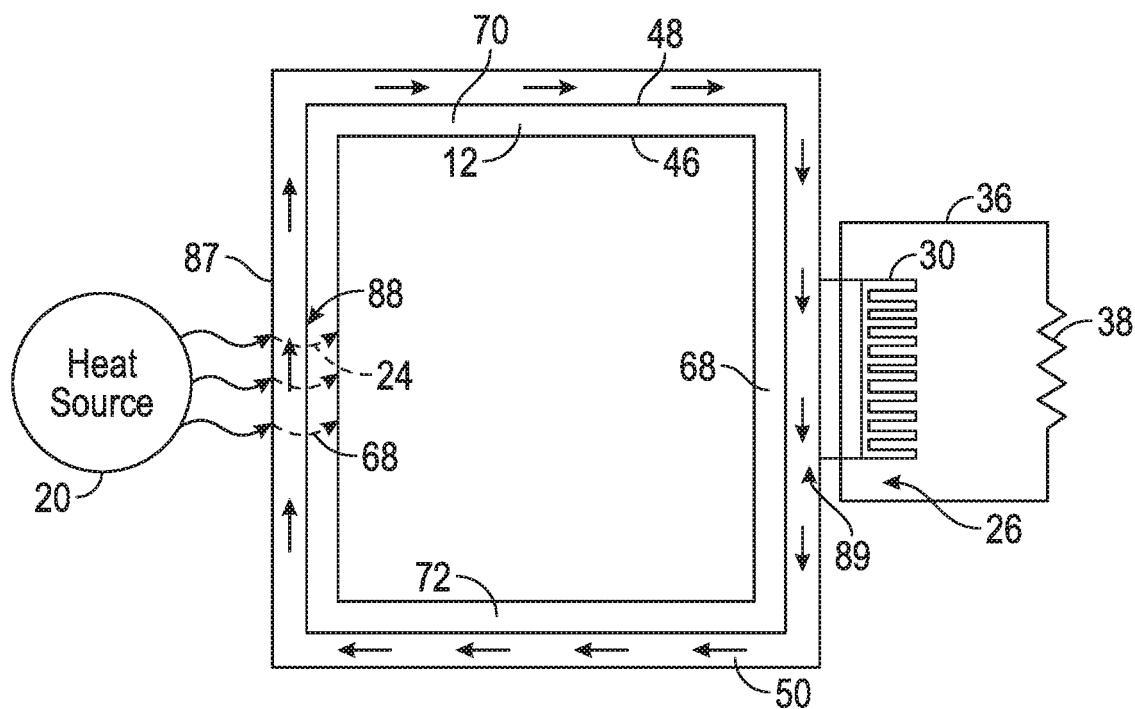
FIG. 4B is a schematic diagram of an alternative embodiment of the disclosed system where the conduit extends along a surface of the barrier.

FIGS. 4A-4B illustrate an alternative embodiment of the system 10 for power delivery based on transferring energy by a primary working fluid 53 flowing within a conduit 50. The conduit 50 is either mounted upon or extends within at least a portion of the barrier 12. In the embodiment as shown in FIG. 4A, the conduit 50 is located within the barrier 12. However, in the embodiment as shown in FIG. 4B, the conduit 50 is located along an outermost surface 48 defined by the barrier 12. Alternatively, in another embodiment, the conduit 50 extends along an innermost surface 46 of the barrier 12 instead.

Turning back to FIG. 4A, the conduit 50 is in thermal communication with the heat source 20 as well as the thermoelectric generator 26. The conduit 50 is a pipe or tube that defines a passageway 54, and is constructed of a heat conducting material. Specifically, the conduit 50 is constructed of a material that allows for the transfer of heat to the primary working fluid 53 contained within the passageway 54 of the conduit 50. This, the conduit 50 is configured to conduct thermal energy 22 by the heat source 20. The primary working fluid 53 contained within the conduit 50 is any type of liquid or gas that absorbs and transmits energy such as, but not limited to, water, oil, or air. The conduit 50 is constructed of a material compatible with the primary working fluid 53 such as, for example, copper, aluminum, or brass. In one non-limiting embodiment, the primary working fluid 53 is water and the conduit 50 is constructed of copper. In one embodiment, the primary working fluid 53 is homogenous. However, as explained in greater detail below and shown in FIG. 4C, in another embodiment the primary working fluid 53 is non-homogenous.

Figure 9A:
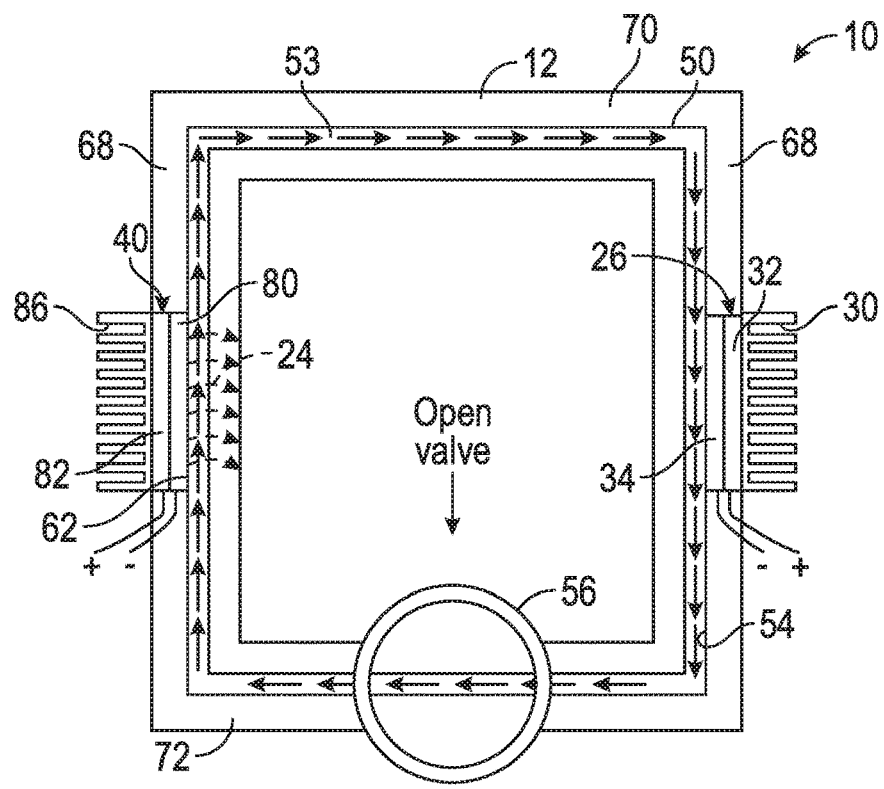
FIGS. 9A-9C are schematic diagrams of an embodiment of the disclosed system including a valve for storing power, where
Figure 9B:
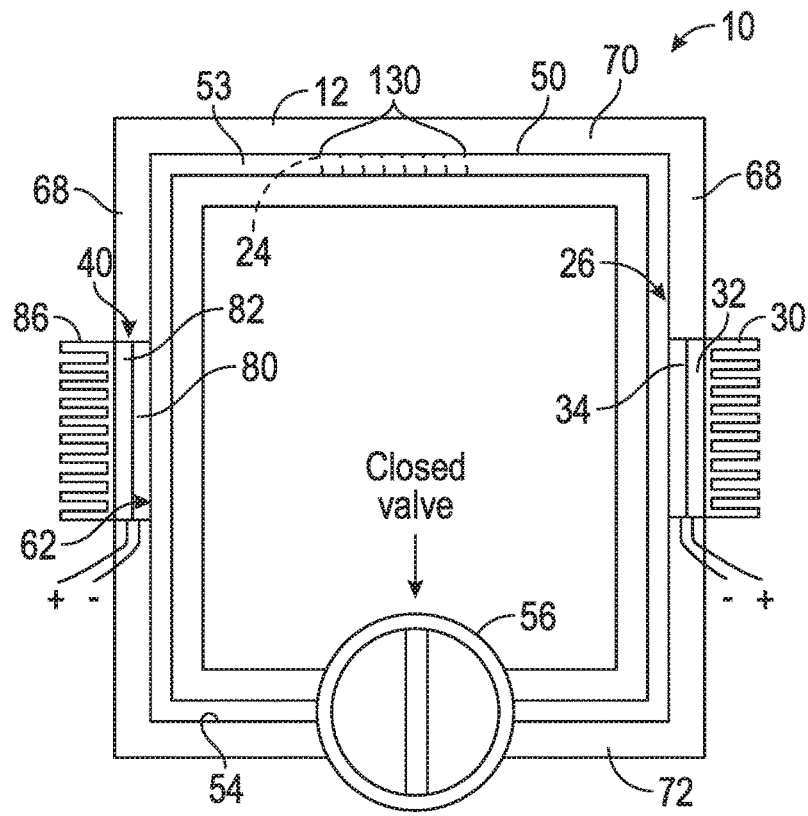
Figure 9C:
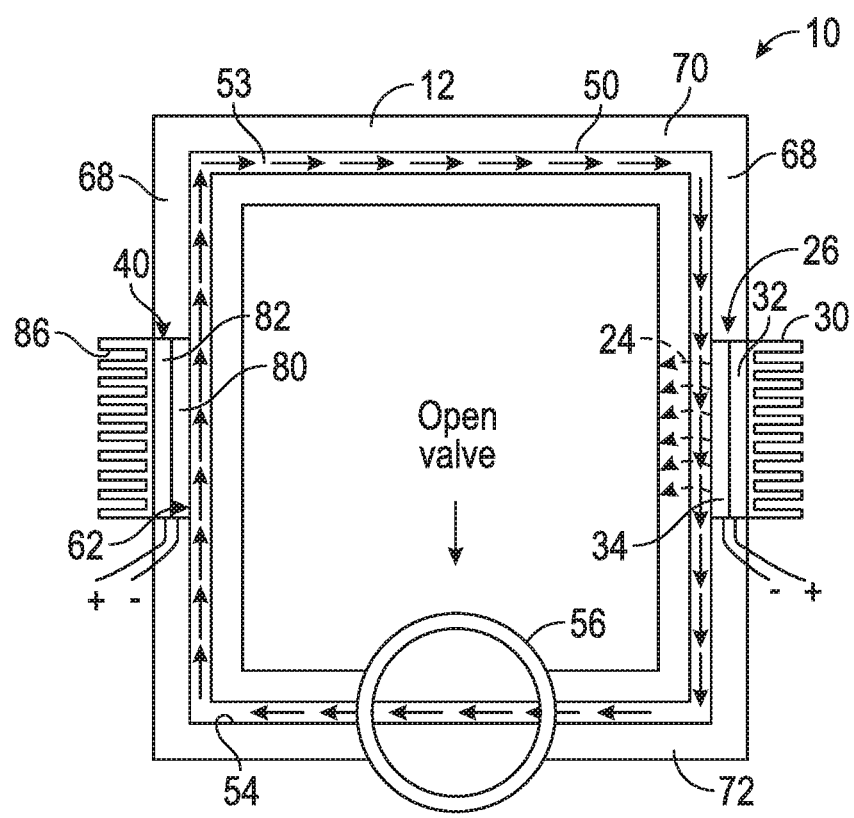

The barrier 12 is part of the enclosure 14. In one embodiment, the conduit 50 is illustrated as a closed-circuit conduit that extends along an entire periphery 52 of the chamber 14. In other words, the conduit 50 provides a continuous path through for the primary working fluid 53 to flow through. However, in the embodiment as shown in FIGS. 9A-9C, a valve 56 is placed within the conduit 50. When the valve is open, the conduit 50 operates as an open-circuit conduit.

Continuing to refer to FIG. 4A, the barrier 12 defines an opening 60, where the heat source 20 is placed directly adjacent to the opening 60. The opening 60 of the barrier 12 is located along an outermost periphery 66 of the barrier 12. The opening 60 creates an exposed portion 62 of the conduit 50. The thermal energy 22 generated by the heat source 20 impacts and is conducted by the exposed portion 62 of the conduit 50. Specifically, the primary working fluid 53 located within the conduit 50 at the exposed portion 62 conducts the thermal energy 22 from the heat source 20.

Figure 8:
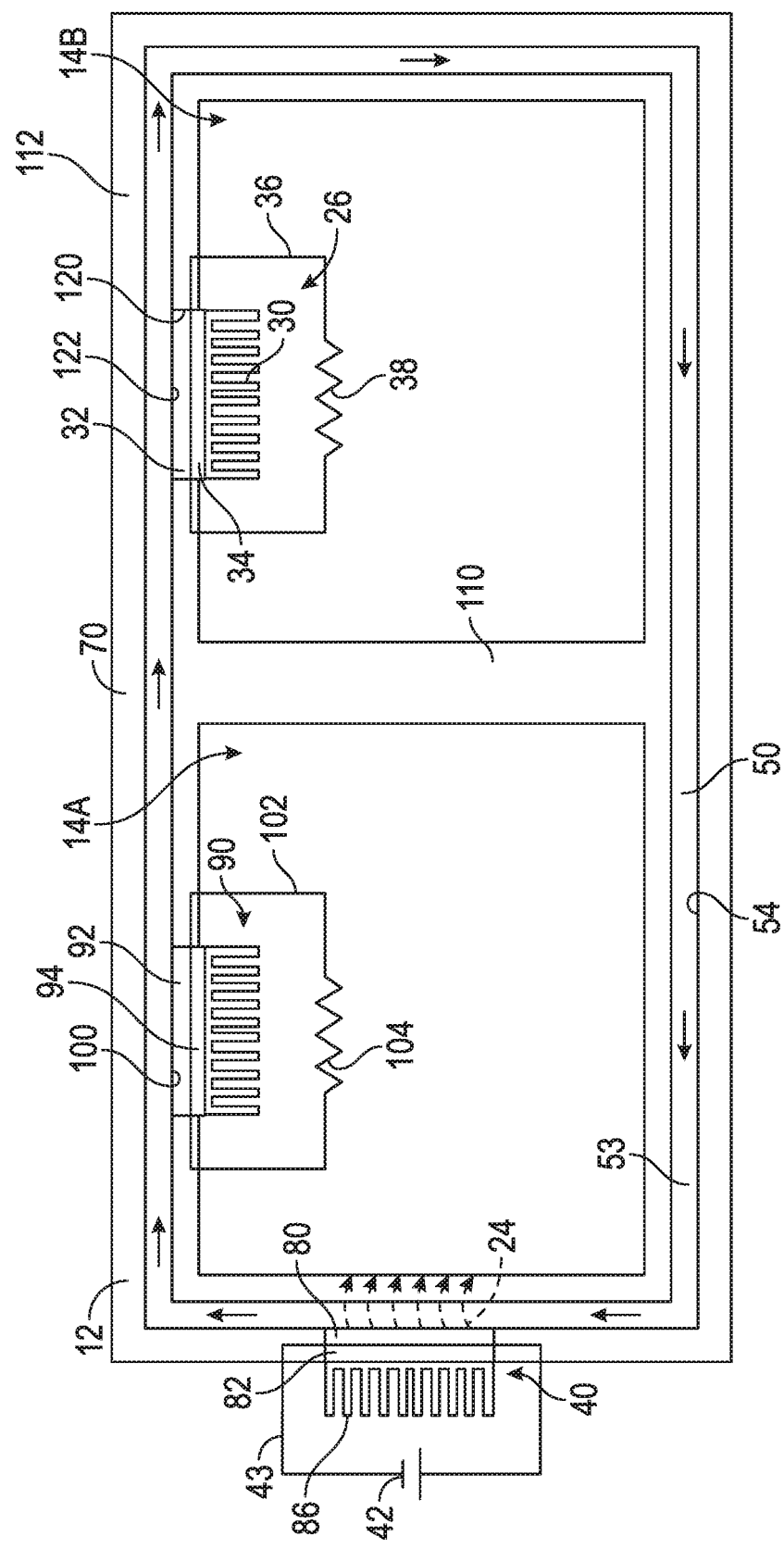
FIG. 8 is a schematic diagram of still another embodiment of the disclosed system, where power is transmitted to multiple thermoelectric generators that are each located in different enclosures.

Although the heat source 20 is shown directly adjacent to the opening 60 in the barrier 12, in another embodiment the heat source 20 directly contacts an outermost surface 64 of the exposed portion 62 of the conduit 50. The barrier 12 includes two opposing sides 68. The opposing sides 68 are positioned to be substantially parallel with respect to one another, and are the side walls of the chamber 14. The chamber 14 also defines an upper side 70 and a lower side 72, where the upper side 70 and the lower side 72 are substantially parallel to one another. The conduit 50 extends around the entire periphery 52 of the chamber 14 and extends through all four sides 68, 70, 72 of the barrier 12. The barrier 12 defines the chamber 14, where the chamber 14 is a closed volume of space. Although FIG. 4A illustrates the thermoelectric generator 26 placed outside of the enclosure, in another embodiment the thermoelectric generator 26 may be placed inside of the enclosure, which is seen in FIG. 8.

The heat source 20 is positioned directly adjacent to the exposed portion 62 of the conduit 50 on one of the sides 68 of the barrier 12 to transmit the thermal energy 22 to the conduit 50. The thermoelectric generator 26 is mounted to an exposed portion 76 of the conduit 50 located at the other of the two opposing sides 68 of the barrier 12. Specifically, the barrier 12 defines an opening 74 along one of the sides 68 of the barrier 12. The opening 74 of the barrier 68 creates the exposed portion 76 of the conduit 50, where the hot side 32 of the thermoelectric generator 26 is in thermal communication with the exposed portion 76 of the conduit 50. In one embodiment, the hot side 32 of the thermoelectric generator 26 makes contact with the exposed portion 76 of the conduit 50. Similar to the embodiment as shown in FIGS. 1-3, the thermoelectric generator 26 may be a thermoelectric module, such as a solid state thermoelectric module.

The conduit 50 is configured to conduct the thermal energy 22 generated by the heat source 20. The thermal energy 22 conducted by the conduit 50 is transferred from the conduit 50 to the primary working fluid 53 flowing within the passageway 54. The heated working fluid 53 flows through the exposed portion 76 of the conduit 50 and transfers the thermal energy conducted from the heat source 20 to the hot side 32 of the thermoelectric generator 26. The cold side 34 of the thermoelectric generator 26 is positioned away from the conduit 50 and contacts the heat sink 30. Therefore, when thermal energy 22 traverses the conduit 50, the hot side 32 of the thermoelectric generator 26 is heated to a temperature greater than the cold side 34 to create electric current. As mentioned above, the electric current in the circuit 36 is conducted to and powers the load 38.

Turning now to FIG. 4B, the conduit 50 is shown disposed along the outermost surface 48 of the barrier 12. The heat source 20 is positioned directly adjacent to a portion 88 of the conduit 50. The thermal energy 22 generated by the heat source 20 impacts and is conducted by the portion 88 of the conduit 50. Although the heat source 20 is shown directly adjacent to the portion 88 of the conduit 50, in another embodiment the heat source 20 directly contacts an outermost surface 87 of the conduit 50. The thermoelectric generator 26 is mounted upon the outermost surface 87 of the conduit 50 as well, at a location 89.

Figure 7:
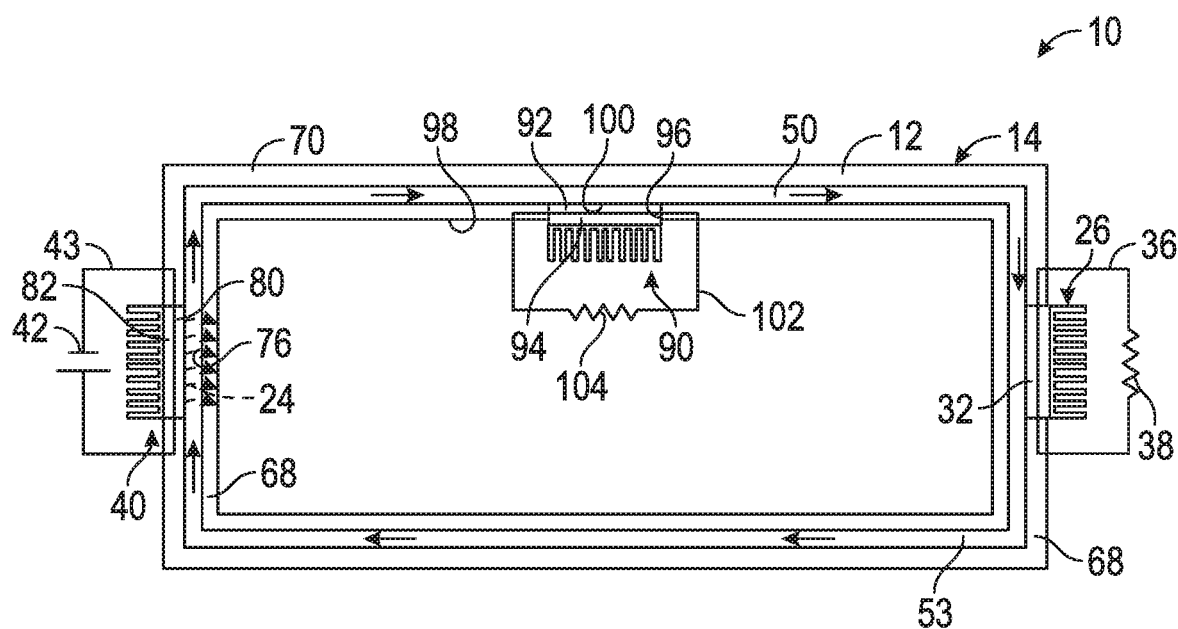
FIG. 7 is a schematic diagram of yet another embodiment of the disclosed system, where power is transmitted to multiple thermoelectric generators.

The conduit 50 allows for power transmission through multiple barriers. For example, in the embodiment as shown in FIGS. 4A and 4B, the thermal energy 22 is transferred from a location along one of the side walls 68 of the barrier 12 to a location along the remaining side wall 68 of the barrier 12. Unlike the embodiments as illustrated in FIGS. 1-3, the embodiments as described in FIGS. 4A and 4B do not require for the thermoelectric generator 26 to be placed within the enclosure 14 at a location directly adjacent to the heat source 20 in order to transfer the thermal energy 24. In other words, the embodiments as shown in FIGS. 4A and 4B transmit power in the form of the thermal energy 22 through the primary working fluid 53 flowing through the conduit 50, and not by the barrier 12 as shown in FIGS. 1-3. Accordingly, there are more locations where the thermoelectric generator 26 may be placed, while still being capable of absorbing the thermal energy 22 generated by the heat source 20. Furthermore, as seen in FIGS. 7 and 8, in one embodiment the thermal energy is transferred to a plurality of thermoelectric generators.

Figure 4C:
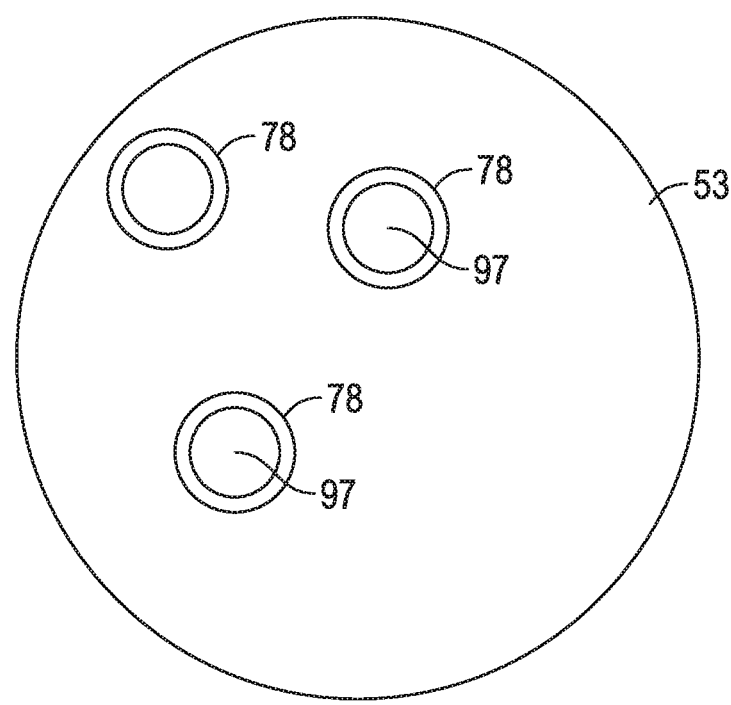
FIG. 4C is a schematic diagram of a primary working fluid containing a secondary working fluid, where a plurality of hollow elements contain the secondary working fluid.

In one embodiment, the primary working fluid 53 is homogenous. However, in another embodiment the primary working fluid 53 is non-homogenous. Turning now to FIG. 4C, in one embodiment hollow elements 78 are dispersed within the primary working fluid 53. In the non-limiting embodiment as shown in FIG. 4C, the hollow elements are substantially spherical, however the hollow elements 78 may include other shapes and configuration as well. The hollow elements 78 contain a secondary working fluid 97. As explained below, the secondary working fluid 97 is configured to absorb and store heat energy. The heat energy is eventually released to the primary working fluid 53 in order to transfer energy when needed. The secondary working fluid 97 may be, for example, oil, water, paraffin wax, or a molten salt. Some examples of molten salts that may be used include, but are not limited to, potassium nitrate, calcium nitrate, sodium nitrate, and lithium nitrate.

The particular type of primary working fluid 53 and the secondary working fluid 97 are selected based on the operating requirements of the system 10 as well as the properties of the primary working fluid 53 and the secondary working fluid 97. Specifically, some examples of properties considered when selecting the specific type of primary working fluid 53 and secondary working fluid 97 include, but are not limited to, corrosiveness, chemical compatibility, specific heat capacity, phase change temperatures, and viscosity. Specific heat capacity is the amount of heat required to change the temperature of 1 kilogram of a substance by 1 degree Kelvin.

In one embodiment, the secondary working fluid 97 has a higher heat capacity and a lower viscosity than the primary working fluid 53. Thus, the secondary working fluid 97 is capable of storing more heat than the primary working fluid 53, which allows for the system 10 to operate over a wide range of temperatures. However, since the secondary working fluid 97 has a lower viscosity, the primary working fluid 53 is able to flow through the conduit 50 more freely. For example, in one illustrative embodiment methanol is the primary working fluid 53 and liquid water is used as the secondary working fluid 97. Methanol has a dynamic viscosity of about $5.44 \times 10^{-4}$ Pa s and a specific heat of 2.14 J/(g K). Liquid water has a dynamic viscosity of about $8.94 \times 10^{-4}$ Pa s and a specific heat of 4.18 J/(g K). Since methanol has a lower viscosity than water, the methanol flows through the conduit 50 more freely. However, since water has a higher specific heat than methanol, water is capable of storing more heat.

In another embodiment, the secondary working fluid 97 is selected to undergo a phase change within a selected temperature range. The secondary working fluid 97 is selected in order to ensure that Equation 1 is valid, where Equation 1 is presented below. This approach is used if system 10 is only required to operate over a relatively narrow range of temperatures, and results in a phase change of the secondary working fluid 97 during operation. For example, in one embodiment the primary working fluid 53 is water, which undergoes a phase change from solid to water at zero degrees Celsius and the secondary working fluid 97 is paraffin wax, which undergoes a phase change from solid to fluid at about thirty seven degrees Celsius. Equation 1 is presented as:

$$L > (C_{1,PV} - C_{2,PV}) \Delta T \qquad \text{Equation 1}$$

where L is the specific latent heat of the secondary working fluid 97 in J/cm$^3$, $C_{1,PV}$ is the isobaric volumetric heat capacity of the primary working fluid 53 in J/cm$^3$/K, $C_{2,PV}$ is the isobaric volumetric heat capacity of the secondary working fluid 97 J/cm$^3$/K, and $\Delta T$ is a temperature difference between the primary working fluid 53 and the secondary working fluid 97 in Kelvin.

The examples presented above are not intended to be limiting in nature, and a variety of different combinations of the primary working fluid 53 and the secondary working fluid 97 may be used. For example, in one embodiment the primary working fluid 53 is oil and the secondary working fluid 97 is water. In another embodiment, the primary working fluid 53 is air and the secondary working fluid 97 is water or wax. In one illustrative embodiment, the conduit 50 includes a diameter of about one inch (2.54 centimeters) and the elements 78 have a diameter of about 0.25 inches (0.635 centimeters).

Figure 5:
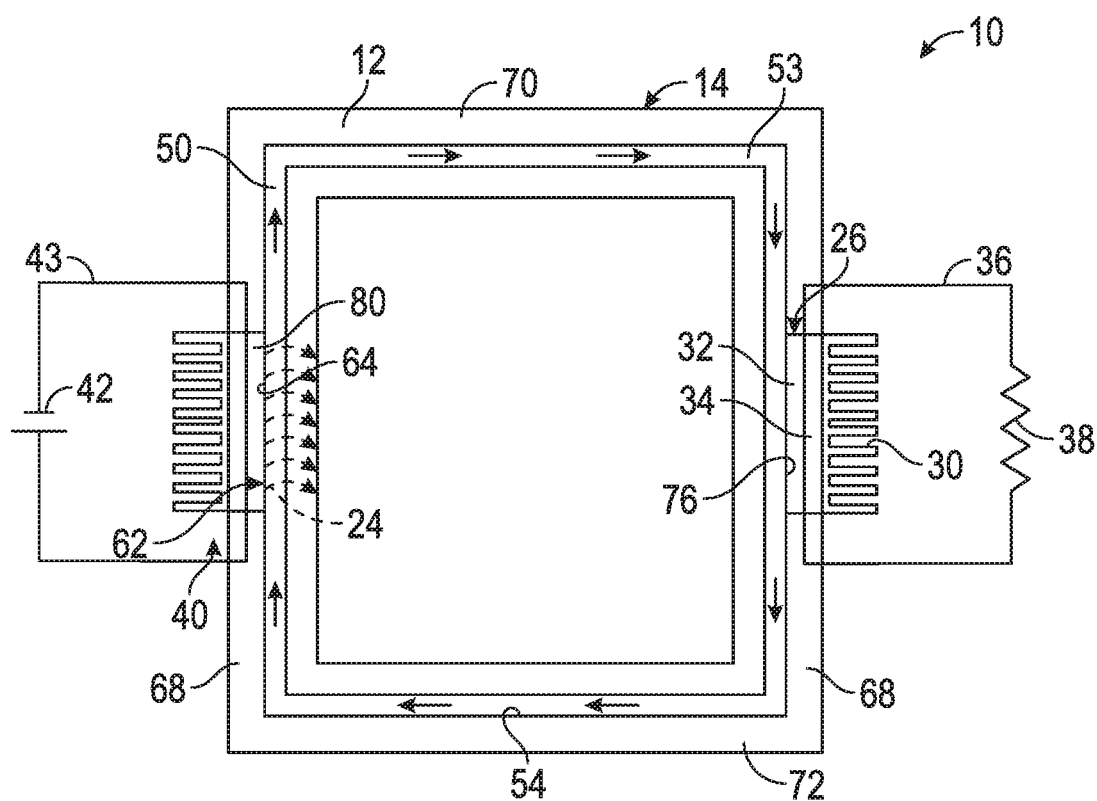
FIG. 5 is an embodiment of the system shown in FIG. 4, utilizing a thermoelectric generator as a heat source.

FIG. 5 is another embodiment where the heat source 20 has been replaced by the second thermoelectric generator 40. The second thermoelectric generator 40 is actuated by the source of direct current 42 provided over the circuit 43. In one embodiment, the second thermoelectric generator 40 may be of the same design, type or size as the thermoelectric generator 26, or it may be of a different design, type or size. In an embodiment, one or both thermoelectric generators 26, 40 are thermoelectric modules. A hot side 80 of the second thermoelectric generator 40 directly contacts the outermost surface 64 of the exposed portion 62 of the conduit 50, and transmits the thermal energy 22 to the conduit 50. As the primary working fluid 53 flows through exposed portion 76 of the conduit 50, the hot side 32 of the thermoelectric generator 26 is heated to a temperature greater than the cold side 34 to create electric current.

Figure 6:
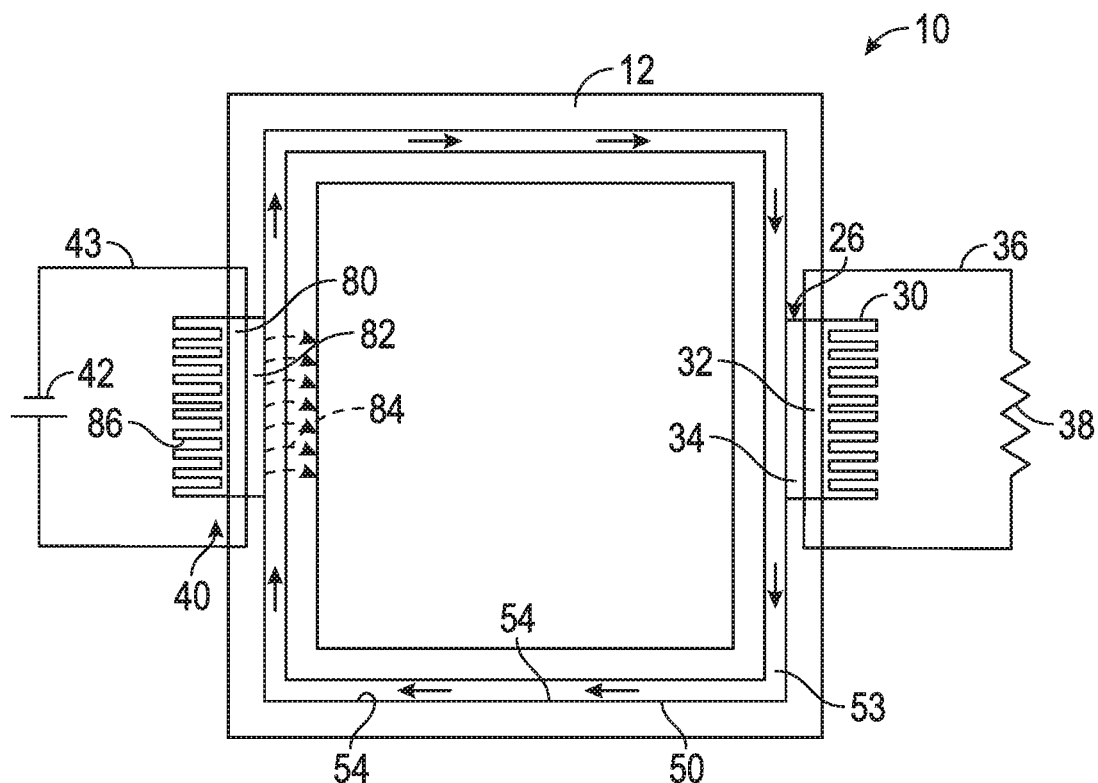
FIG. 6 is a schematic diagram of an alternative embodiment of the disclosed system where the primary working fluid is cooled to distribute power to the thermoelectric generator.

FIG. 6 is yet another embodiment where a cold side 82 of the second thermoelectric generator 40 contacts the conduit 50, and the hot side 80 of the second thermoelectric generator 40 contacts a heat sink 86. Therefore, instead of heating the primary working fluid 53 flowing within the conduit 50, the second thermoelectric generator 40 cools the primary working fluid. Thus, the cold side 82 of the second thermoelectric generator 40 is in thermal communication with the conduit 50, and acts as a cooling source to provide cooling 84 to the primary working fluid 53. The conduit 50 is configured to conduct the cooling 84 generated by the cooling source 82 and transfer the cooling 84 to the primary working fluid 53 flowing within the passageway 54. The primary working fluid 53 transfers the cooling 84 to the cold side 34 of the thermoelectric generator 26, thereby cooling the cold side 34 of the thermoelectric generator 26 to a temperature less than the hot side 32 to create electric current.

FIG. 7 is another embodiment where the second thermoelectric generator 40 transmits the thermal energy 22 to multiple thermoelectric generators. The thermoelectric generator 26 is located in the same position as shown in FIGS. 4A, 5 and 6, which is outside of the enclosure 14 defined by the barrier 12. Similar to the embodiment as shown in FIG. 5, the hot side 32 of the thermoelectric generator 26 contacts the exposed portion 76 of the conduit 50. A third thermoelectric generator 90 is located inside of the enclosure 14 and is in thermal communication with the conduit 50. A hot side 92 of the third thermoelectric generator 90 contacts the conduit 50, and is heated to a temperature greater than a cold side 94 to create electric current. Specifically, the third thermoelectric generator 90 is mounted to the conduit 50 at an opening 96 defined by the upper side 70 of the barrier 12. An innermost surface 98 of the upper side 70 of the barrier 12 defines the opening 96, where the opening 96 of the upper side 70 of the barrier 12 creates an exposed portion 100 of the conduit 50. In the embodiment as shown, the hot side 92 of the third thermoelectric generator 90 is in thermal communication with the conduit 50. Specifically, the hot side 92 of the third thermoelectric generator 90 contacts the exposed portion 100 of the conduit 50 and is heated to a temperature greater than the cold side 94 to create electric current. The electric current in a circuit 102 is conducted to and powers a load 104.

FIG. 8 is another embodiment where the barrier 12 defines two different enclosures 14A, and 14B. Specifically, the barrier 12 defines a dividing wall 110 that splits the enclosure 14 into a first enclosure 14A and a second enclosure 14B. The conduit 50 does not extend within the dividing wall 110, and instead extends around an outermost periphery 112 defined by both enclosures 14A, 14B. Similar to the embodiment as shown in FIG. 7, the hot side 80 of the second thermoelectric generator 40 contacts the exposed portion 62 of the conduit 50, thereby transmitting the thermal energy 22 to the primary working fluid 53 flowing within the passageway 54 of the conduit 50.

The third thermoelectric generator 90 is located inside of the first enclosure 14A and the thermoelectric generator 26 is located inside of the second enclosure 14B. The hot side 92 of the third thermoelectric generator 90 contacts the exposed portion 100 of the conduit 50. The thermoelectric generator 26 is located within the enclosure 14B. An opening 120 is defined by the upper side 70 of the barrier 12. The opening 120 of the barrier 12 creates an exposed portion 122 of the conduit 50. The hot side 32 of the thermoelectric generator 26 contacts the exposed portion 122 of the conduit 50 and is heated to a temperature greater than the cold side 34 to create electric current. Thus, as seen in FIG. 8 the second thermoelectric generator 40 transmits power to a plurality of thermoelectric generators 26, 90 each located in different enclosures 14A, 14B.

FIGS. 9A, 9B, and 9C illustrate an embodiment including the valve 56, which is placed within the conduit 50. As explained below, the valve 56 allows for the storage of thermal energy 22. The valve 56 is fluidly connected to the conduit 50. The valve 56 is opened to allow the primary working fluid 53 to flow through the conduit 50 (seen in FIGS. 9A and 9C), and the valve 56 is closed to restrict or stop the primary working fluid 53 from flowing within the conduit 50 (shown in FIG. 9B). The valve 56 is located along the lower side 72 of the barrier 12 and blocks the primary working fluid 53 from flowing when in a closed position, which is seen in FIG. 9B. Although the valve 56 is located along the lower side 72 of the barrier 12, in another embodiment the valve 56 is placed along one of the opposing sides 68 or the upper side 70.

In one embodiment, the valve 56 is a butterfly valve, however other types of valves that isolate or shut off the flow of fluid may be used as well. The second thermoelectric generator 40 first injects power into the system 10 by generating the thermal energy 22. The thermal energy 22 heats the primary working fluid 53 flowing through the conduit 50. Specifically, the hot side 80 of the second thermoelectric generator 40 contacts the exposed portion 62 of the conduit 50, thereby transferring the thermal energy 22 to the primary working fluid 53 flowing within the passageway 54 of the conduit 50.

Turning now to FIG. 9B, after the hot side 80 of the thermoelectric generator 40 heats a portion of the primary working fluid 53 within the conduit 50, the valve 56 is then closed, thereby restricting or stopping the flow of the primary working fluid 53 within the conduit 50. As seen in FIG. 9B, a heated portion 130 of the primary working fluid 53 is suspended within the conduit 50, between the thermoelectric generators 26, 40. The primary working fluid 53 continues to stay suspended until the valve 56 is re-opened (FIG. 9C). Therefore, the valve 56 allows for the system 10 to store power in the form of the thermal energy 22 within the primary working fluid 53.

Referring now to FIG. 9C, the valve 56 is re-opened to allow the primary working fluid 53 to flow in the clockwise direction, and the primary working fluid 53 flows towards the hot side 32 of the thermoelectric generator 26. Similar to the embodiment shown in FIG. 4, as the primary working fluid 53 flows through the conduit 50 at the exposed portion 76, and the thermal energy 22 is transferred to the hot side 32 of the thermoelectric generator 26.

Figure 10:
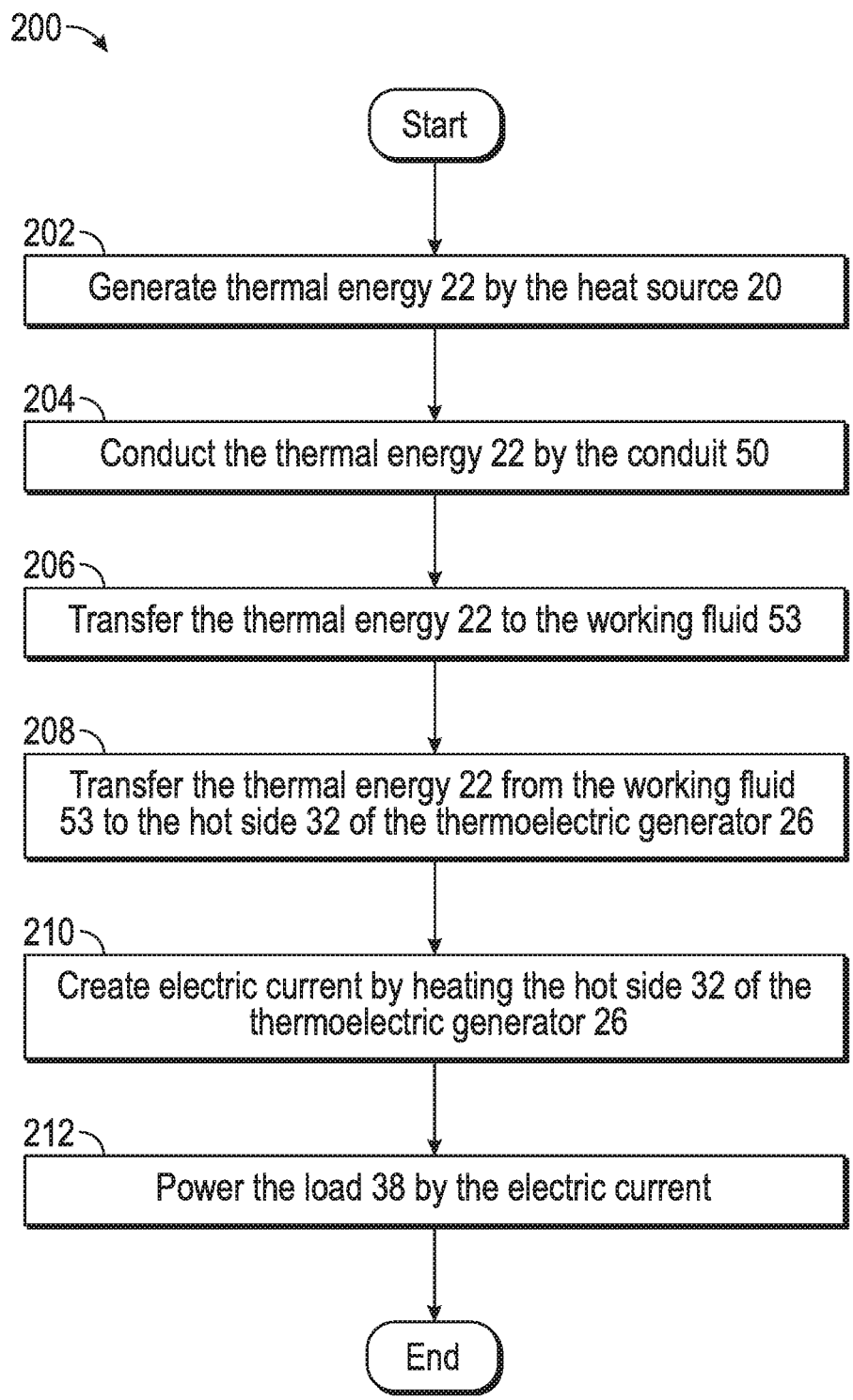
FIG. 10 is a process flow diagram illustrating an exemplary method of conveying power from a heat source to power a load.

FIG. 10 is a process flow diagram illustrating a method 200 for conveying power from a heat source 20 to power the load 38 (FIG. 4A). Referring now to both FIGS. 4A, 4B, and 10, the method 200 begins at block 202. In block 202, the method includes generating thermal energy 22 by the heat source 20. The heat source 20 is in thermal communication with the conduit 50, and the conduit 50 is either mounted upon or extends within at least a portion of a barrier 12. The method 200 then proceeds to block 204.

In block 204, the method includes conducting the thermal energy 22 by the conduit 50. As mentioned above, the conduit 50 is constructed of a heat conducting material and defines the passageway 54 that contains the primary working fluid 53. The method 200 then proceeds to block 206.

In block 206, the method includes transferring the thermal energy 22 generated by the heat source 20 to the primary working fluid 53 flowing within the passageway 54. The method 200 may then proceed to block 208.

In block 208, the method includes transferring the thermal energy 22 from the primary working fluid 53 to the hot side 32 of the thermoelectric generator 26 to heat the hot side 32 of the thermoelectric generator 26 to a temperature greater than the cold side 34. The method 200 then proceeds to block 210.

In block 210, the method includes creating electric current by heating the hot side 32 to the temperature greater than the cold side 34 to create electric current. The method 200 then proceeds to block 212.

In block 212, the electric current flowing in the circuit 36 powers the load 38. The method 200 may then terminate.

Referring generally to FIGS. 4A-9C, the disclosed system includes a conduit for transporting working fluid from a heat source to one or more thermoelectric generators, thereby transferring power. The system as described in FIGS. 4-9C do not require the thermoelectric generator to be placed in a location along the barrier adjacent to the heat source in order to transfer the thermal energy. This is because power is transmitted by the primary working fluid within the conduit. Thus, the system described in FIGS. 4A-9C may provide enhanced flexibility when determining the specific location of the heat source and the various thermoelectric generators.

While the forms of apparatus and methods described herein constitute preferred embodiments of the invention, other systems and methods may be employed without departing from the scope of the invention.

What is claimed is:

1. A system (10) for conveying power from a heat source (20) generating thermal energy (22), the system comprising:
a barrier (12) defining an enclosure (14) that is a closed volume of space wherein the barrier (12) is a hermetically sealed chamber;
a conduit (50) constructed of a heat conducting material, the conduit (50) defining a passageway (54) containing a primary working fluid (53), wherein the conduit (50) is either mounted upon or extends within at least a portion of the barrier (12) and extends around an entire periphery of the enclosure (14), and wherein the thermal energy (22) generated by the heat source (20) is directly transferred to only a portion (88) of the conduit, and the thermal energy (22) is transferred to the primary working fluid (53) flowing within the passageway (54); and
a thermoelectric generator (26) in thermal communication with the conduit (50), the thermoelectric generator (26) having a hot side (32) and a cold side (34), wherein the primary working fluid (53) transfers the thermal energy (22) to the hot side (32) of the thermoelectric generator (26) to heat the hot side (32) of the thermoelectric generator (26) to a temperature greater than the cold side (34) and create electric current.

2. The system of claim 1, wherein the barrier (12) defines an opening (60), and wherein the heat source (20) is placed directly adjacent to the opening (60).

3. The system of claim 1, wherein the barrier (12) defines an opening (60) that creates an exposed portion (64) of the conduit (50), and wherein the heat source (20) directly contacts an outermost surface (64) of the exposed portion (64) of the conduit (50).

4. The system of claim 1, wherein the conduit (50) is mounted upon the barrier (12), and the thermoelectric generator (26) is mounted upon an outermost surface (87) of the conduit (50).

5. The system of claim 1, wherein the primary working fluid (53) is non-homogeneous and includes a plurality of hollow elements (78) dispersed within the primary working fluid (53), and wherein the plurality of hollow elements (78) contain a secondary working fluid (97).

6. The system of claim 5, wherein the secondary working fluid (97) is selected based on:

$$L > (C_{1,PV} - C_{2,PV}) \Delta T$$

where L is a specific latent heat of the secondary working fluid (97) in J/cm$^3$, $C_{1,PV}$ is an isobaric volumetric heat capacity of the primary working fluid (53) in J/cm$^3$/K, $C_{2,PV}$ is an isobaric volumetric heat capacity of the secondary working fluid (97) J/cm$^3$/K, and $\Delta T$ is a temperature difference between the primary working fluid (53) and the secondary working fluid (97) in Kelvin.

7. The system of claim 5, wherein a viscosity of the secondary working fluid (97) is greater than a viscosity of the primary working fluid (53).

8. The system of claim 1, wherein the heat source (20) is a second thermoelectric generator (40).

9. The system of claim 8, wherein the system (10) comprises a third thermoelectric generator (90) located inside of the enclosure (14) and in thermal communication with the conduit (50).

10. The system of claim 1, wherein a dividing wall (110) splits the enclosure (14) into a first enclosure (14A) and a second enclosure (14B).

11. The system of claim 10, comprising a second thermoelectric generator (40) that is the heat source (20) and a third thermoelectric generator (90), wherein the third thermoelectric generator (90) is located inside of the first enclosure (14A) and the second thermoelectric generator (40) is located inside of the second enclosure (14B).

12. The system of claim 1, comprising a valve (56) fluidly connected to the conduit (50), wherein the valve (56) opens to allow the primary working fluid (53) to flow through the conduit (50) and the valve (56) closes to restrict the primary working fluid (53) from flowing within the conduit (50).

13. The system of claim 1, comprising a valve (56) fluidly connected to the conduit (50), wherein the valve (56) opens to allow the primary working fluid (53) to flow through the conduit (50) and the valve (56) closes to restrict the primary working fluid (53) from flowing within the conduit (50).

14. The system of claim 13, wherein a heated portion (130) of the primary working fluid (153) is suspended within the conduit (50) to create stored energy when the valve (56) is closed.

15. A method for conveying power from a heat source (20), the method comprising:
generating thermal energy (22) by the heat source (20), wherein the heat source (20) is in thermal communication with a conduit (50), and wherein a barrier(12) defines an enclosure (14) that is a closed volume of space and the barrier(12) is a hermetically sealed chamber;
conducting the thermal energy (22) by the conduit (50), wherein the thermal energy (22) generated by the heat source (20) is directly transferred to only a portion (88) of the conduit (50), and the conduit (50) is either mounted upon or extends within at least a portion of a barrier(12) and extends around an entire periphery of the enclosure (14) and defines a passageway (54) that contains a primary working fluid (53);
transferring the thermal energy (22) generated by the heat source (20) to the primary working fluid (53);
transferring the thermal energy (22) from the primary working fluid (53) to a hot side (32) of a thermoelectric generator (26), wherein the thermoelectric generator (26) is in thermal communication with the conduit (50) and includes the hot side (32) and a cold side (34); and
heating the hot side (32) of the thermoelectric generator (26) to a temperature greater than the cold side (34) of the thermoelectric generator (26) to create electric current.

16. The method of claim 15, comprising conducting the electric current in a circuit (36) to power a load (38).

17. The method of claim 15, comprising providing a second thermoelectric generator (40) as the heat source (20).

18. The method of claim 15, comprising mounting the conduit (50) upon the barrier (12), and mounting the thermoelectric generator (26) upon an outermost surface (87) of the conduit (50).

19. The method of claim 15, comprising opening a valve (56) to allow the primary working fluid (53) to flow through the conduit (50), and closing the valve (56) to restrict the primary working fluid (53) from flowing within the conduit (50).

20. The method of claim 19, comprising suspending a heated portion (130) of the primary working fluid (153) within the conduit (50) to create stored energy when the valve (56) is closed.

* * * * *